(12) United States Patent
Kanazawa

(10) Patent No.: US 10,978,308 B2
(45) Date of Patent: Apr. 13, 2021

(54) METHOD FOR MANUFACTURING A SEMICONDUCTOR DEVICE

(71) Applicant: RENESAS ELECTRONICS CORPORATION, Tokyo (JP)

(72) Inventor: Masaaki Kanazawa, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 74 days.

(21) Appl. No.: 16/408,058

(22) Filed: May 9, 2019

(65) Prior Publication Data
US 2019/0371614 A1 Dec. 5, 2019

(30) Foreign Application Priority Data

May 31, 2018 (JP) .............................. JP2018-104784

(51) Int. Cl.
| | | |
|---|---|---|
| *H01L 21/308* | (2006.01) | |
| *H01L 29/66* | (2006.01) | |
| *H01L 21/033* | (2006.01) | |
| *H01L 21/768* | (2006.01) | |

(52) U.S. Cl.
CPC ...... *H01L 21/3086* (2013.01); *H01L 21/0332* (2013.01); *H01L 21/0337* (2013.01); *H01L 21/3081* (2013.01); *H01L 21/76897* (2013.01); *H01L 29/66734* (2013.01)

(58) Field of Classification Search
CPC combination set(s) only.
See application file for complete search history.

(56) References Cited

U.S. PATENT DOCUMENTS

| | | | |
|---|---|---|---|
| 6,888,196 B2 | 5/2005 | Kobayashi | |
| 2011/0207329 A1* | 8/2011 | Shih | H01L 21/31144 438/702 |
| 2014/0291753 A1* | 10/2014 | Hsieh | H01L 29/7813 257/330 |

FOREIGN PATENT DOCUMENTS

JP 2003-318396 A 11/2003

\* cited by examiner

*Primary Examiner* — Ratisha Mehta
(74) *Attorney, Agent, or Firm* — McDermott Will & Emery LLP

(57) ABSTRACT method of manufacturing a semiconductor device capable of manufacturing a miniaturized semiconductor device is provided. The method of manufacturing a semiconductor device according to an embodiment includes the steps of: preparing a semiconductor substrate having a first surface and a second surface which is an opposite surface of the first surface; forming a hard mask having an opening on the first surface; forming a gate trench extending toward the second surface on the first surface using the hard mask as a mask; widening the width of the opening; filling the opening with an interlayer insulating film; and forming a contact hole in the interlayer insulating film by removing the hard mask.

8 Claims, 23 Drawing Sheets

METHOD FOR MANUFACTURING A SEMICONDUCTOR DEVICE

CROSS-REFERENCE TO RELATED APPLICATIONS

The disclosure of Japanese Patent Application No. 2018-104784 filed on May 31, 2018 including the specification, drawings and abstract is incorporated herein by reference in its entirety.

BACKGROUND

The present invention relates to a method of manufacturing a semiconductor device.

The semiconductor device disclosed in Japanese unexamined Patent Application publication No. 2003-318396 includes a semiconductor substrate, a gate oxide film, a gate electrode, an interlayer insulating film, and a contact plug.

The semiconductor substrate has a first surface and a second surface that is an opposite surface of the first surface. An N+-type silicon substrate disposed on the second surface. An N--type epitaxial layer is formed on the first surface side of the N+-type silicon substrate. An N+-type source layer is formed on the first surface. In the semiconductor substrate, a P-type base layer is formed so as to be sandwiched between an N+-type source layer and an N--type epitaxial layer.

A first trench extending toward the second surface is formed in the first surface so as to reach the N--type epitaxial layer.

A gate oxide film is formed on the bottom surface and the side surface of the first trench. A gate electrode is buried in the first trench. The interlayer insulating film is formed on the first surface. Contact holes are formed in the interlayer insulating film and the semiconductor substrate.
The contact hole penetrates the interlayer insulating film and extends toward the second surface so as to reach the P-type base layer. Contact plugs are buried in the contact holes.

SUMMARY

In the semiconductor device described in Japanese unexamined Patent Application publication No. 2003-318396, the contact hole is formed by the following method. First, an interlayer insulating film is formed on the first surface. Second, the photoresist is patterned by photolithography. Third, the interlayer insulating film and the semiconductor substrate are etched using the patterned photoresist.

If a mask shift occurs in patterning the photoresist, a shift occurs in the position where the contact hole is formed. For this reason, the design of the semiconductor device disclosed in Patent Document 1 must be performed in consideration of the fact that the contact hole is formed at a different position, and therefore there is room for improvement in miniaturization thereof.

Other objects and novel features will become apparent from the description of this specification and the accompanying drawings The method of manufacturing a semiconductor device according to an embodiment includes a step of preparing a semiconductor substrate, a step of forming a hard mask having an opening, a step of forming a gate trench, a step of widening the width of the opening, a step of burying an interlayer insulating film in the opening, and a step of forming a contact hole in the interlayer insulating film by removing the hard mask. The semiconductor substrate has a first surface and a second surface that is an opposite surface of the first surface. The hard mask is formed on the first surface. The gate trench is formed on the first surface using the hard mask as a mask. The gate trench extends toward the second surface.

According to the method for manufacturing a semiconductor device according to the embodiment, a miniaturized semiconductor device can be manufactured.

DETAILED DESCRIPTION

Figure 1:
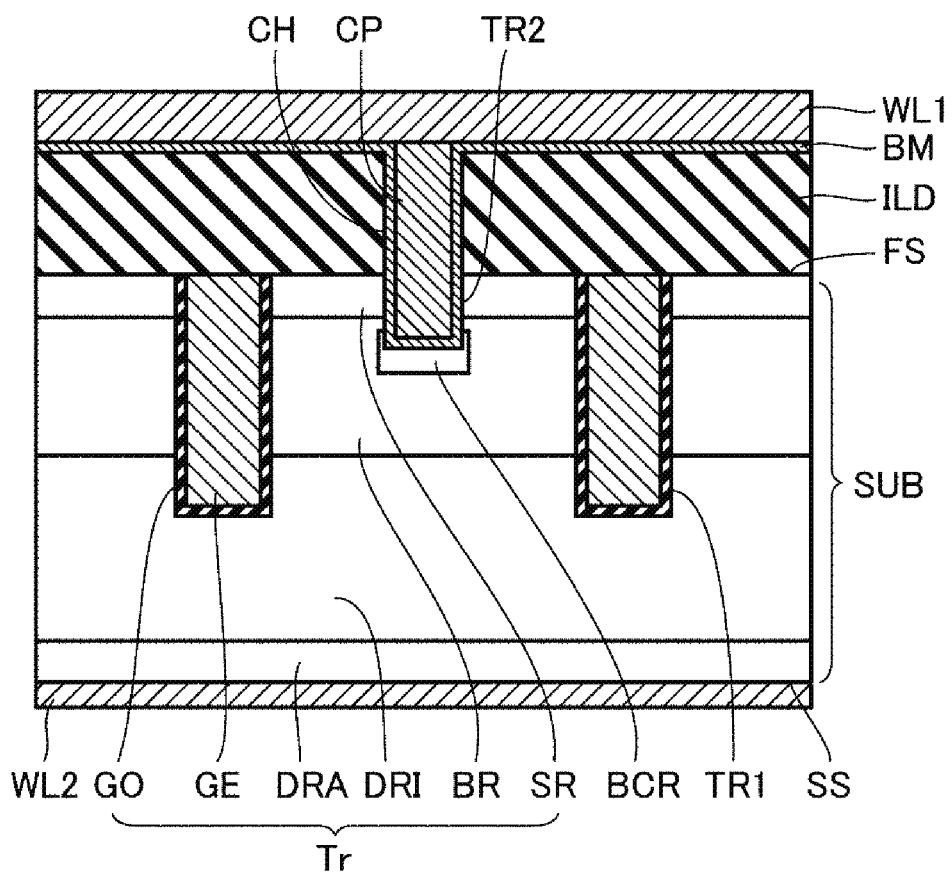
FIG. 1 is a cross-sectional view of the semiconductor device according to the first embodiment.

In the following drawings, the same or corresponding parts are denoted by the same reference numerals, and the description thereof will not be repeated. At least some of the embodiments described below may be arbitrarily combined.

FIRST EMBODIMENT

The configuration of the semiconductor device according to the first embodiment will be described below.

As shown in FIG. 1, the semiconductor device according to the first embodiment is a trench-gate type power MOSFET (Metal Oxide Semiconductor Field Effect Transistor). More specifically, the semiconductor device according to the first embodiment includes a semiconductor substrate SUB, a gate insulating film GO, a gate GE, an interlayer insulating film ILD, contact plugs CP, a source electrode WL1, a drain electrode WL2, and a gate electrode WL3.

The semiconductor substrate SUB has a first surface FS and a second surface SS. The second surface SS is an opposite surface of the first surface FS. The first surface FS and the second surface SS constitute a main surface of the semiconductor substrate SUB. The semiconductor substrate SUB formed of, for example, single crystal silicon (Si).

A source region SR, a drain region DRA, a drift region DRI, a body region BR, and a body contact region BCR are formed in the semiconductor substrate SUB. The source region SR is formed on the first surface FS. The drain region DRA is formed on the second surface SS. The drift region DRI is formed on the first surface FS side of the drain region DRA. The body region BR is formed so as to be sandwiched between the source region SR and the drift region DRI. The body contact regions BCRs are formed on the bottom surfaces of the gate trenches TR1, which will be described later.

The conductivity types of the source region SR, the drift region DRI, and the drain region DRA are the first conductivity type, and the conductivity types of the body region BR and the body contact region BCR are the second conductivity type. The second conductivity type is the opposite conductivity type of the first conductivity type. For example, when the first conductivity type is n-type, the second conductivity type is p-type. The impurity concentration in the drift region DRI is lower than the impurity concentration in the source region SR and the impurity concentration in the drain region DRA.

A gate trench TR1 is formed in the first surface FS. The gate trench TR1 extends toward the second surface SS. The gate trench TR1 extends to reach the drift region DRI. That is, the source region SR, the body region BR, and the drift region DRI are exposed from the side surface of the gate trench TR1.

A contact trench TR2 is formed in the first surface FS. The contact trench TR2 extends toward the second surface SS. The contact trench TR2 extends to reach the body area BR. The contact trenches TR2 are formed between adjacent gate trenches TR1.

The gate insulating film GO is formed on the first surface FS. More specifically, the gate insulating film GO is formed on the side surface and the bottom surface of the gate trench TR1. The gate insulating film GO is formed of, for example, a silicon oxide ($SiO_2$).

The gate GE is buried in the gate trench TR1 by being formed on the gate insulating film GO. The gate GE faces the body region BR while being insulated by the gate insulating film GO. The gate GE is formed of, for example, polycrystalline silicon doped with impurities.

The source region SR, the drain region DRA, the drift region DRI, the body region BR, the gate insulating film GO, and the gate GE constitute a transistor Tr which is a trench-gate type power MOSFET.

The interlayer insulating film ILD is formed on the first surface FS.

The interlayer insulating film ILD is formed of, for example, silicon oxide. The interlayer insulating film ILD is preferably formed of a non-doped silicon oxide, that is, NSG (Non-doped Silicon Glass). The interlayer insulating film ILD may be formed of silicon oxide doped with an impurity, for example, BPSG (Boron Phosphorous Silicon Glass.

A contact hole CH is formed in the interlayer insulating film ILD. The contact hole CH is connected to the contact trench TR2. Preferably, the side surface of the contact hole CH and the side surface of the contact trench. TR2 are flush with each other.

A barrier metal BM is formed on the interlayer insulating film ILD, the side surface of the contact hole CH, the side surface of the contact trench TR2, and the bottom surface of the contact trench TR2. The barrier metal BM is formed of, for example, titanium (Ti) or titanium nitride (TiN). The side surface of the contact trench TR2 and the bottom surface of the contact trench TR2 are silicided by the reaction between the barrier metal BM and silicon in the semiconductor substrate SUB.

The contact plugs CP are buried in the contact holes CH and the contact trenches TR2. The contact plug CP is formed of, for example, tungsten (W). The contact plug CP is electrically connected to the source region SR and the body contact region BCR.

The source electrode WL1 is formed on the interlayer insulating film ILD. The source electrodes WL1 are made of aluminum or aluminum alloys, for example. The source electrodes WL1 are electrically connected to the contact plugs CPs.

The drain electrode WL2 is formed on the second surface SS. The drain electrodes WL2 are formed of, for example, aluminum or aluminum alloys. The drain electrodes WL2 are electrically connected to the drain regions DRAs.

Figure 2:
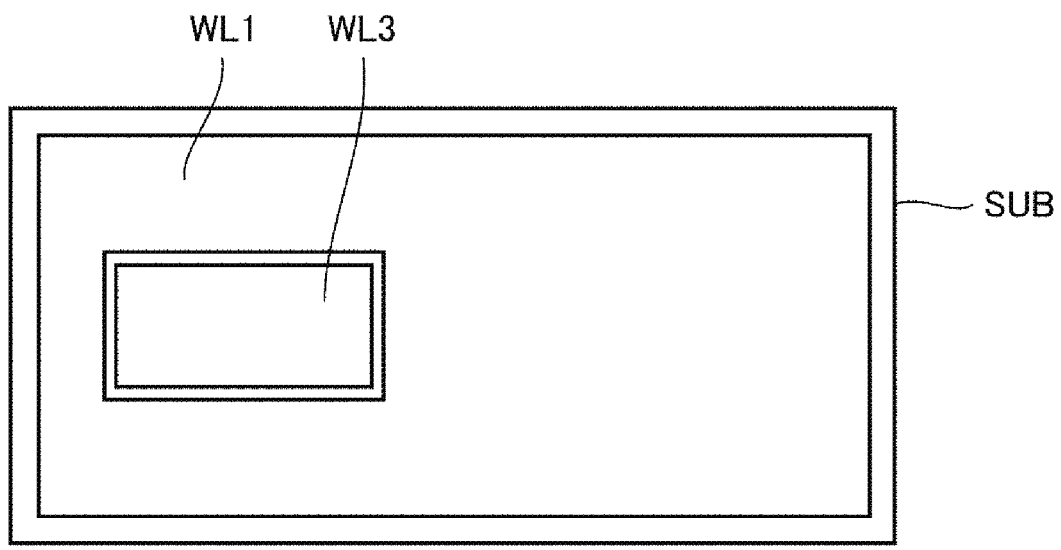
FIG. 2 is a top view of the semiconductor device according to the first embodiment.

As shown in FIG. 2, the gate electrode WL3 is formed on the interlaver insulating film ILD. Though not shown, the gate electrodes WL3 are electrically connected to the gates GE buried in the gate trenches TR1.

Figure 3:
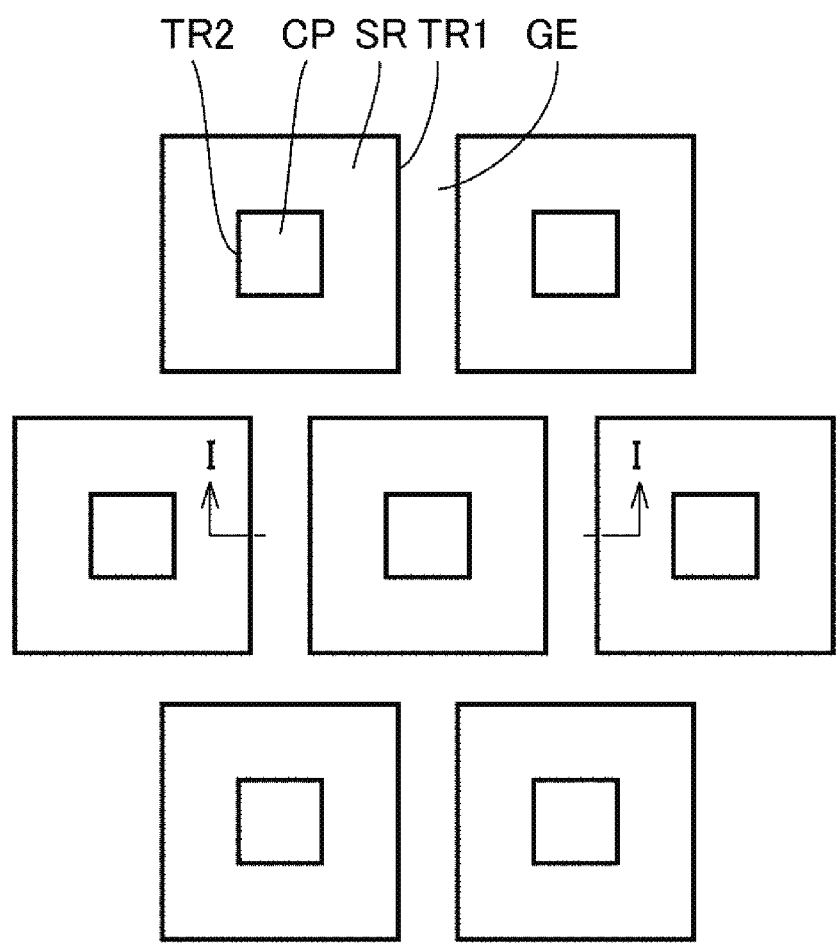
FIG. 3 is an enlarged top view of the semiconductor device according to the first embodiment.
Figure 4:
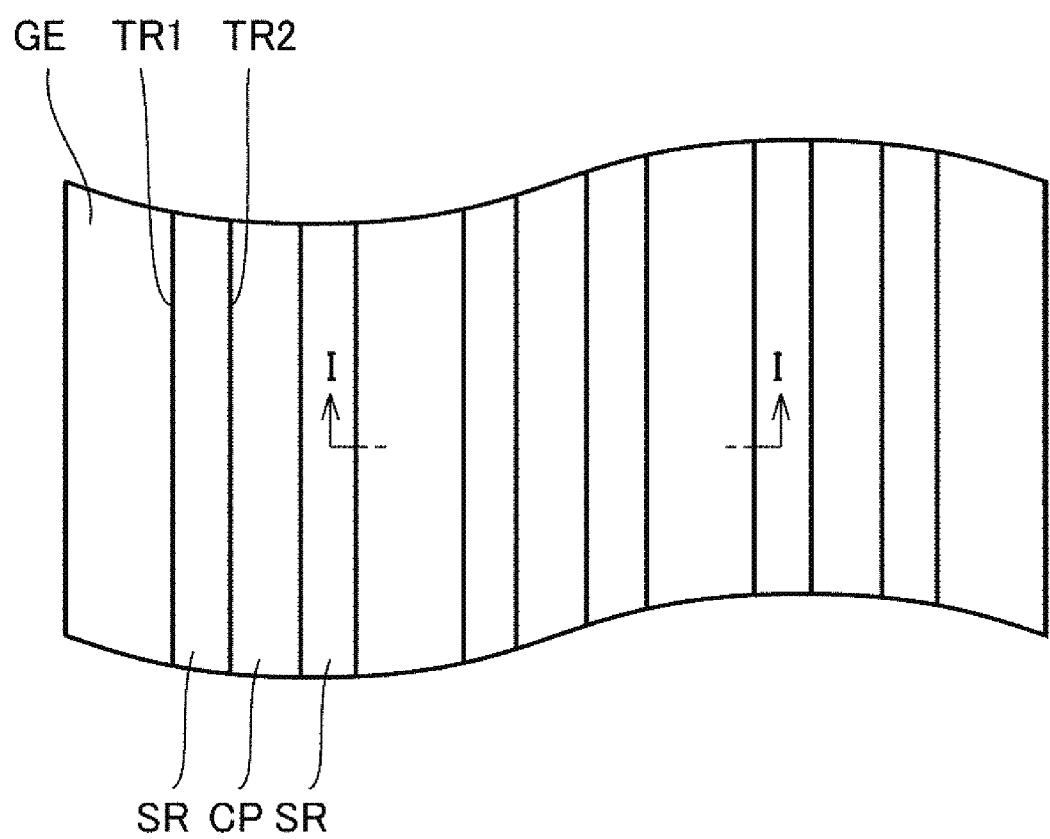
FIG. 4 is an enlarged top view of a semiconductor device according to a modification of the first embodiment.

As shown in FIG. 3, the transistor Tr may have a mesh cell structure. That is, in plan view, the contact trench TR2 may be surrounded by a rectangular gate trench TR1. As shown in FIG. 4, the transistor Tr may have a stripe structure. That is, in plan view, the gate trench TR1 and the contact trench TR2 may extend along the first direction, and the gate trench TR1 and the contact trench TR2 may be alternately arranged in the second direction intersecting the first direction. The cross-section taken along the line I-I in FIG. 3 and FIG. 4 corresponds to the cross-sectional structure shown in FIG. 1.

Although the semiconductor device according to the first embodiment is a trench gate type power MOSFET, the semiconductor device according to the first embodiment may be a trench gate type power IGBT (Insulated Gate Bipolar Transistor). When the semiconductor device according to the first embodiment is a trench-gate type IGBT, an impurity region of the second conductivity type is formed in place of the drift region DRI which is an impurity region of the first conductivity type.

Hereinafter, a method of manufacturing a semiconductor device according to the first embodiment will be described.

Figure 5:
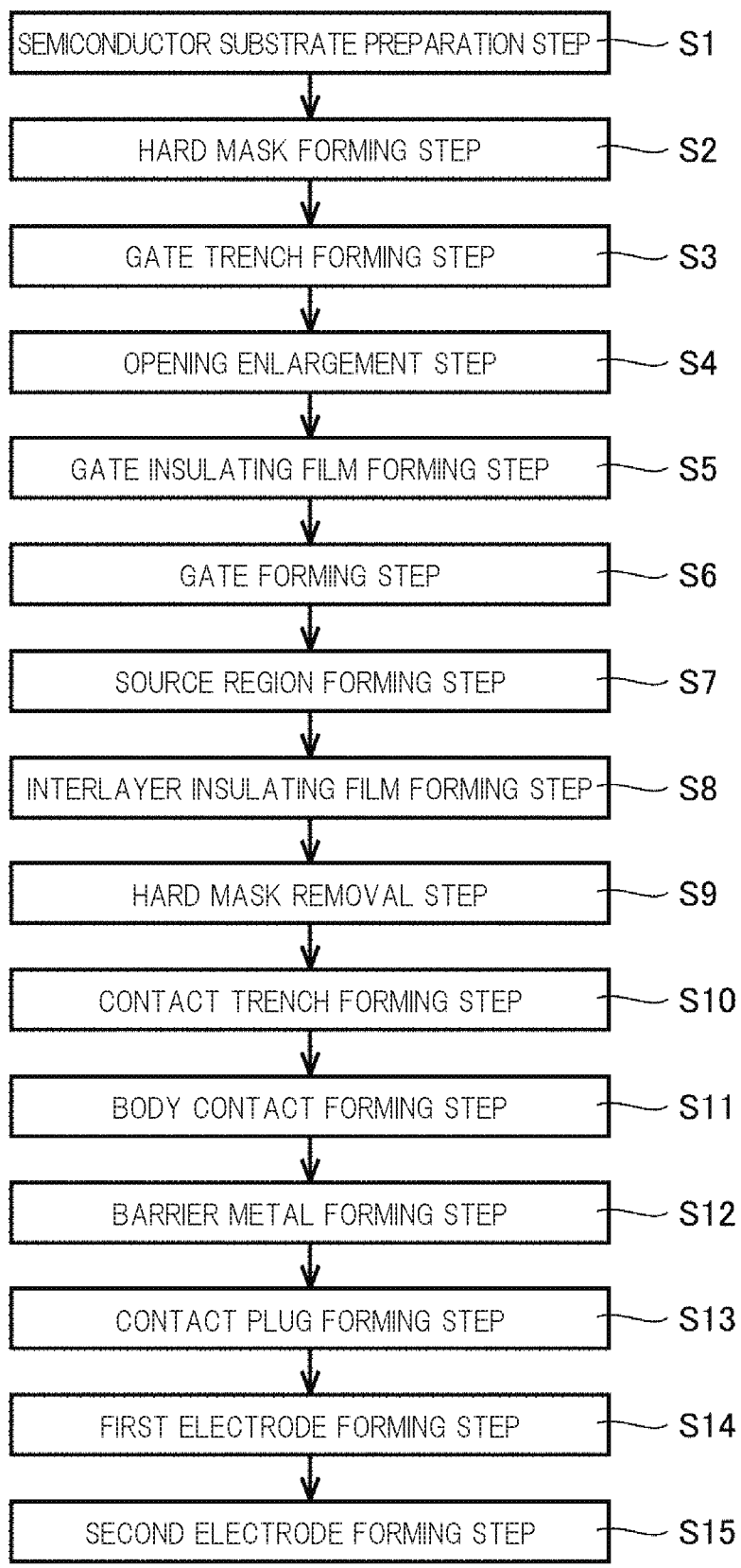
FIG. 5 is a process diagram showing the method of manufacturing the semiconductor device according to the first embodiment.

As shown in FIG. 5, the method of manufacturing a semiconductor device according to the first embodiment includes a semiconductor substrate preparation step S1, a hard mask forming step S2, a gate trench forming step S3, an opening enlargement step S4, a gate insulating film forming step 5, a gate forming step S6, and a source region forming step S7.

The method of manufacturing a semiconductor device according to the first embodiment further includes an interlayer insulating film forming step S8, a hard mask removing step S9, a contact trench forming step S10, a body contact region forming step S11, a barrier metal forming step S12, a contact plug forming step S13, a first electrode forming step S14, and a second electrode forming step S15.

Figure 6:
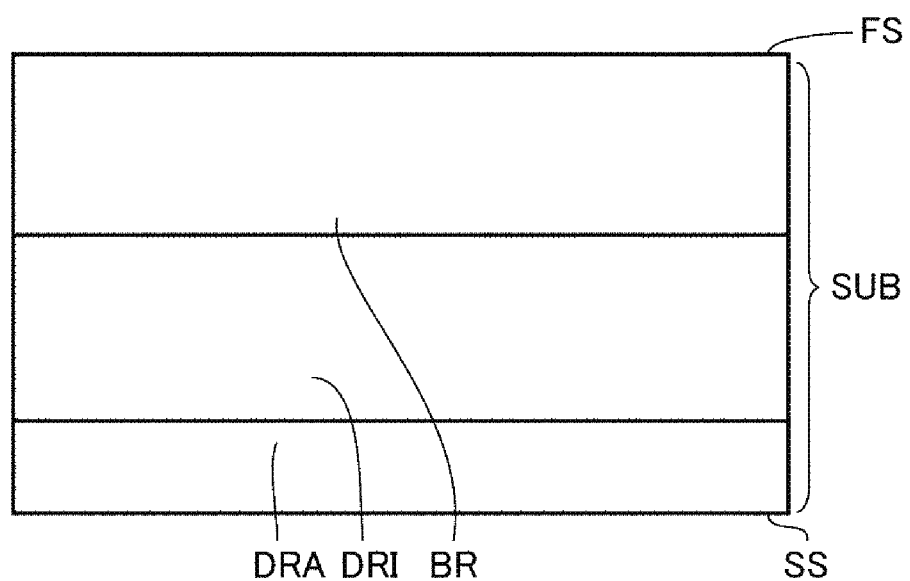
FIG. 6 is a cross-sectional view of the semiconductor device according to the first embodiment in the semiconductor substrate preparation step S1.

As shown in FIG. 6, in the semiconductor substrate preparation step S1, a semiconductor substrate SUB is prepared. In the semiconductor substrate SUB prepared in the semiconductor substrate preparation step S1, a drain region DRA, a drift region DRI, and a body region BR are formed.

In the semiconductor substrate preparation step S1, first, the semiconductor substrate SUB in which the drain region DRA is formed is prepared. Second, the drift region DRI is epitaxially grown on the drain region DRA. Third, the bodyregion BR is formed by controlling ion implantation and heat treatment on the first surface FS side.

Figure 7:
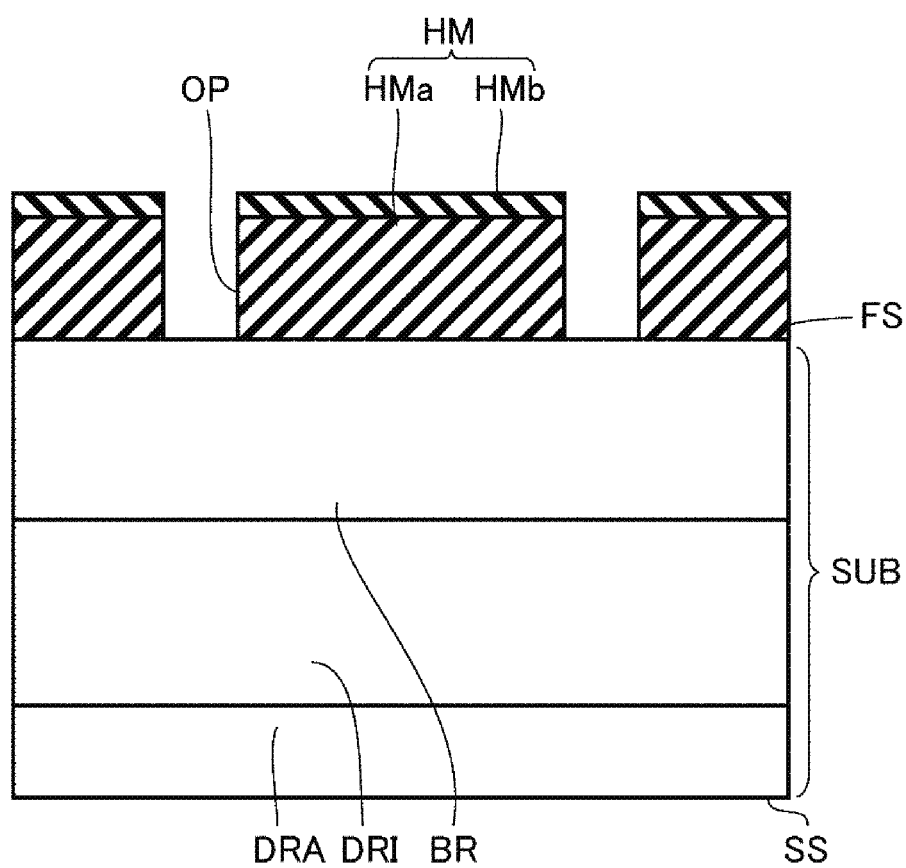
FIG. 7 is a cross-sectional view of the semiconductor device according to the first embodiment in the hard mask forming step S 2.

In the hard mask forming step S2, the hard mask HM is formed as shown in FIG. 7. The hard mask HM has a first film HMa and a second film HMb. The first film HMa is formed on the first surface FS. The second film HMb is formed on the first film HMa. The first film HMa and the second film HMb are formed of different materials. The first film HMa is formed of, for example, silicon nitride ($Si_3N_4$). The second film HMb is formed of, for example, silicon oxide. The hard mask HM has an opening OP.

In the I of the hard mask HM, first, the first film HMa and the second film HMb are formed. The first film HMa and the second film HMb are formed by, for example, CVD (Chemical Vapor Deposition). In the formation of the hard mask HM, second, a photoresist is formed on the second film HMb.

Third, in the formation of the hard mask HM, patterning of the photoresist is performed. The patterning is performed by photolithography. In the formation of the hard mask HM, fourth, etching of the first film HMa and the second film HMb is performed using the photoresist as a mask. As a result, the hard mask HM having the opening OP is formed.

Figure 8:
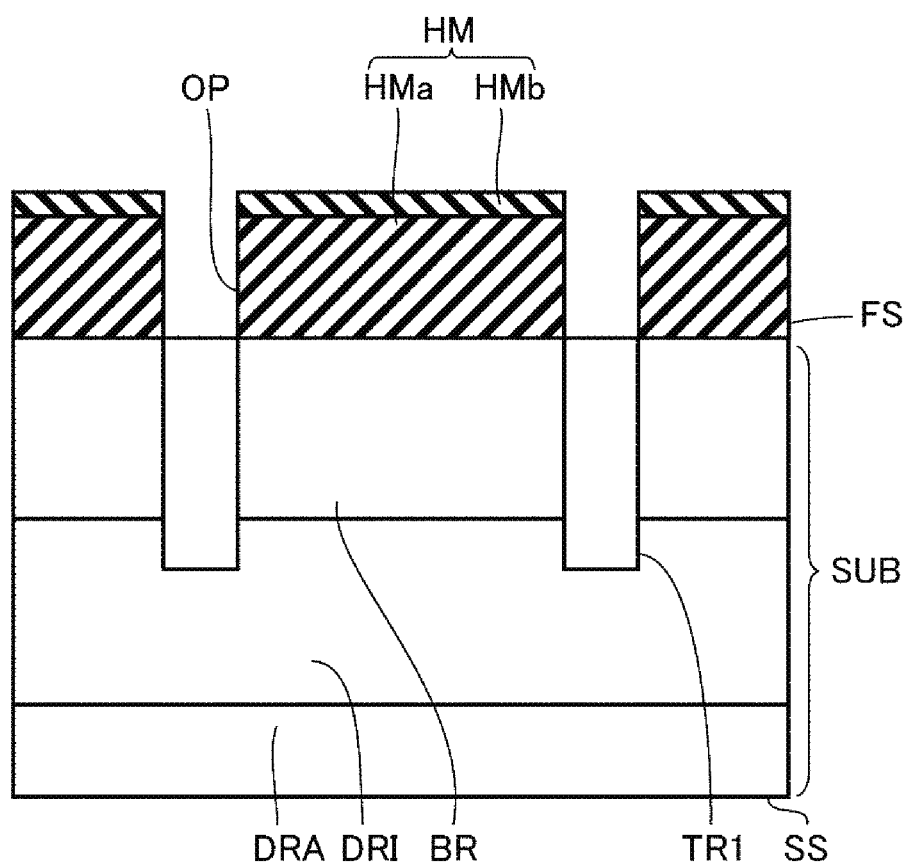
FIG. 8 is a cross-sectional view of the semiconductor device according to the first embodiment in the gate trench forming step S3.

In the gate trench forming step S3, the gate trench TR1 is formed as shown in FIG. 8. The gate trench TR1 is formed by anisotropic etching such as RIE (Reactive Ion Etching) using the hard mask EM as a mask.

Figure 9:
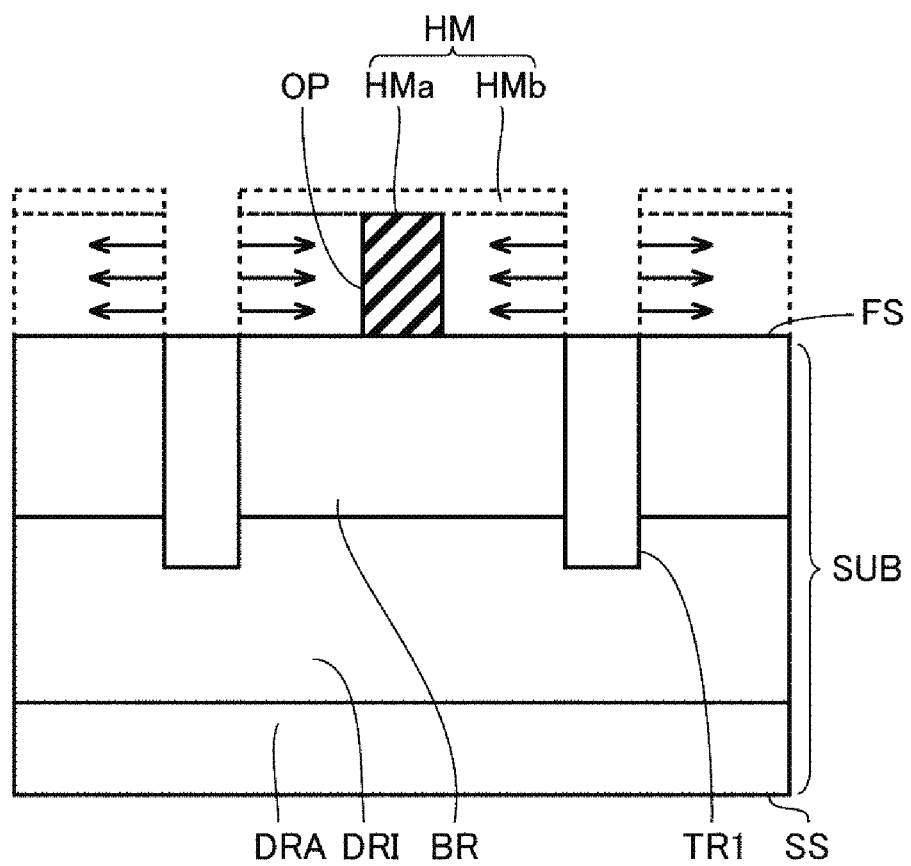
FIG. 9 is a cross-sectional view of the semiconductor device according to the first embodiment in the opening enlarging step S4.

In the opening enlarging step S4, as shown in FIG. 9, the width of the opening OP is enlarged. That is, in the opening enlarging step S4, the end of the opening OP is retreated so as to increase the distance from the gate trench TR1. The opening OP is enlarged by isotropic etching. The isotropic etching is performed by dry etching using, for example, an etching gas containing tetrafluoromethane ($CF_4$), oxygen gas ($O_2$), and nitrogen gas ($N_2$). The isotropic etching may be performed by wet etching using phosphoric acid. After the isotropic etching is performed, the second film HMb is removed.

Figure 10:
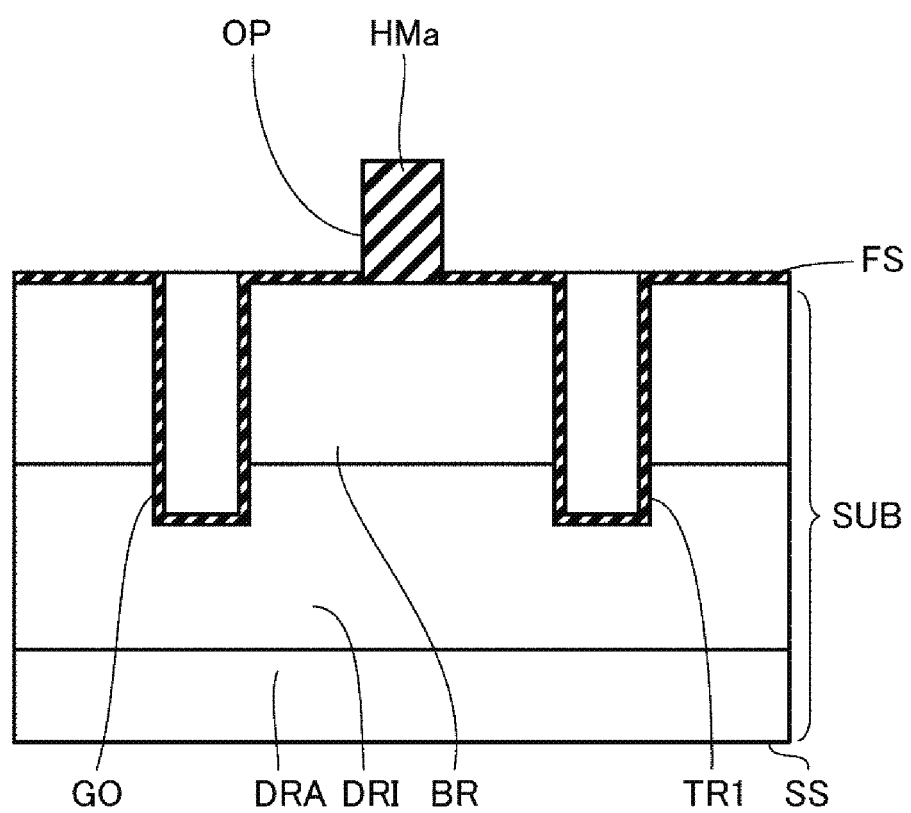
FIG. 10 is a cross-sectional view of the semiconductor device according to the first embodiment in the gate insulating film forming step S5.

In the gate insulating film forming step S5, the gate insulating film GO is formed as shown in FIG. 10. The gate insulating film GO is formed by, for example, thermal oxidation.

Figure 11:
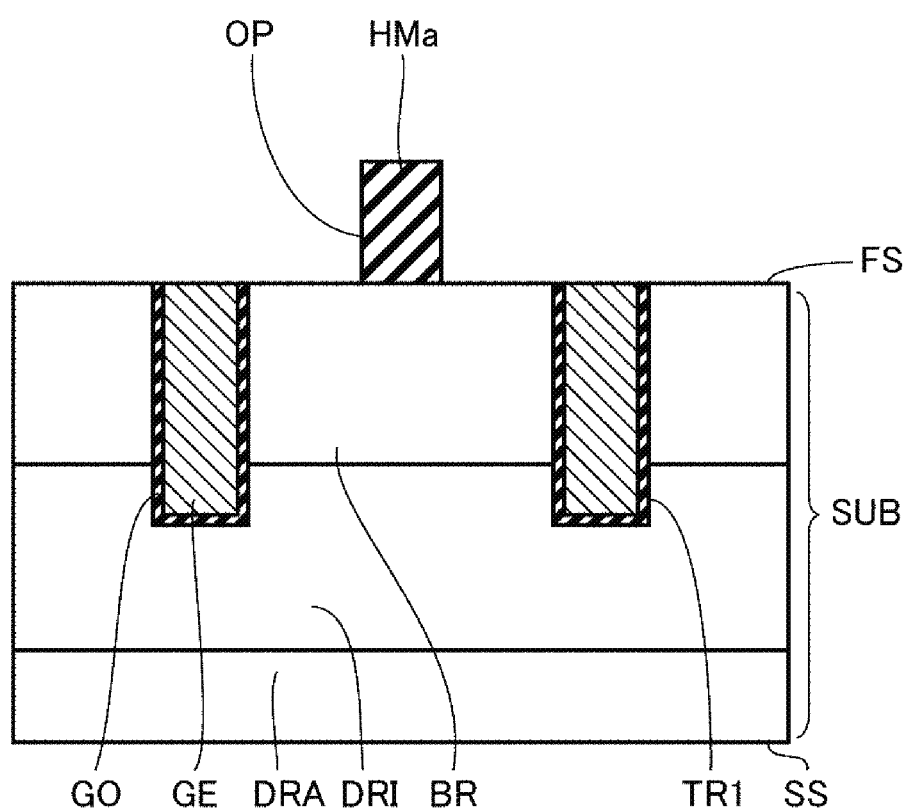
FIG. 11 is a cross-sectional view of the semiconductor device according to the first embodiment in the gate forming step S6.

In the gate forming process S 6, the gate GE is formed as shown in FIG. 11. In forming the gate GE, first, materials constituting the gate GE are buried in the gate trench TR1 by CVD or the like. In forming the gate GE, second, materials constituting the gate GE protruding from the gate trench TR1 are removed by, for example, etch-back.

Figure 12:
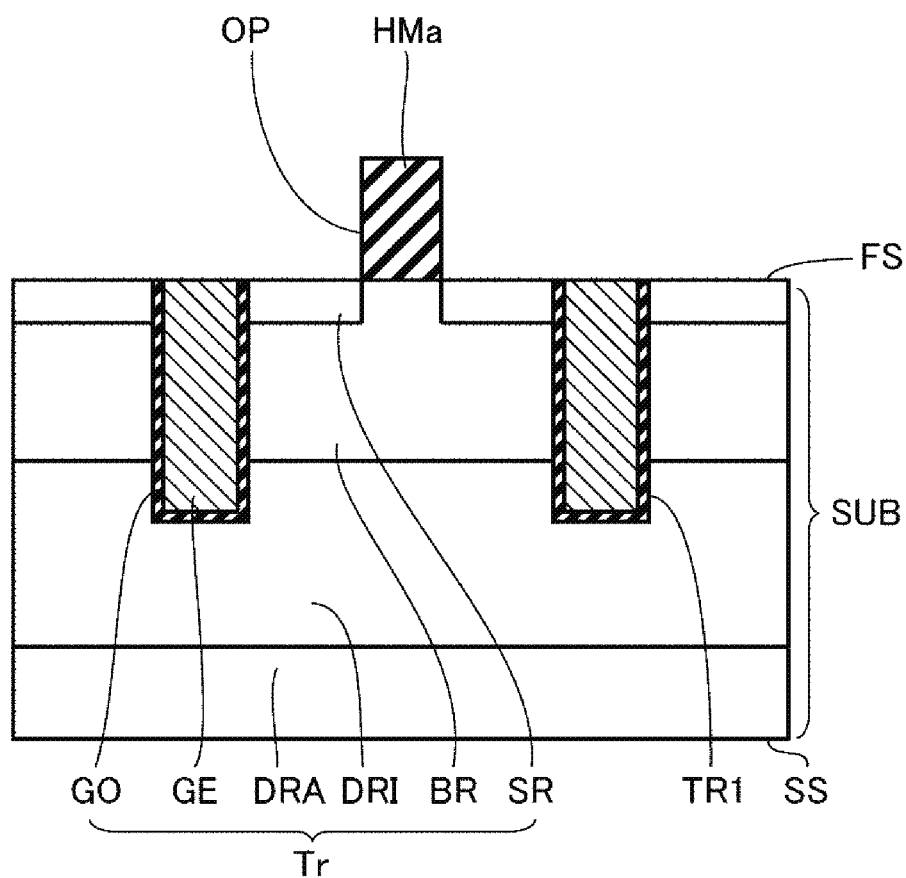
FIG. 12 is a cross-sectional view of the semiconductor device according to the first embodiment in the source region forming step S7.

In the source region forming step S7, a source region SR is formed as shown in FIG. 12. Source region SR is formed by control of ion implantation and heat treatment using hard mask EM (first membrane HMa).

Figure 13:
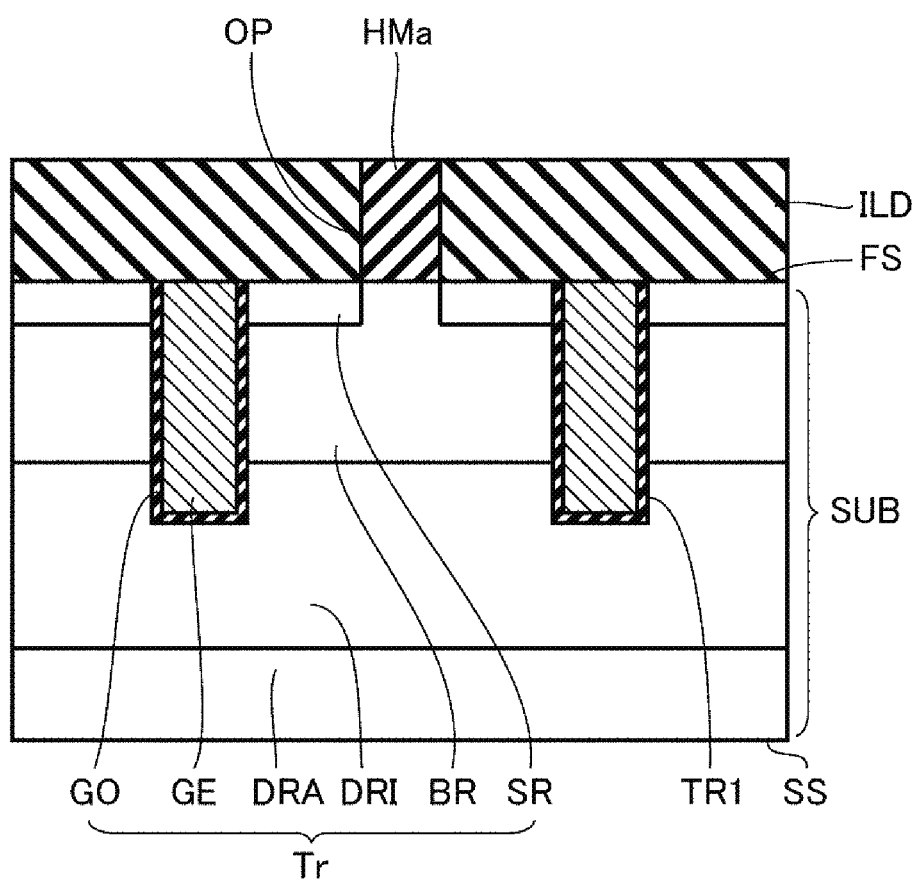
FIG. 13 is a cross-sectional view of the semiconductor device according to the first embodiment in the interlayer insulating film forming step S8.

In the interlayer insulating film forming step S8, as shown in FIG. 13, the interlayer insulating film ILD is formed. The interlayer insulating film ILD is buried in the opening OP. In the formation of the interlayer insulating film ILD, first, a material constituting the interlayer insulating film ILD is formed on the first surface FS. In the formation of the interlayer insulating film ILD, second, etching back is performed on the material constituting the formed interlayer insulating film ILD. The etch back is carried out until the hard mask HM (first film HMa) is exposed. Instead of etch-back, CMP (Chemical Mechanical Polishing) may be performed.

Figure 14:
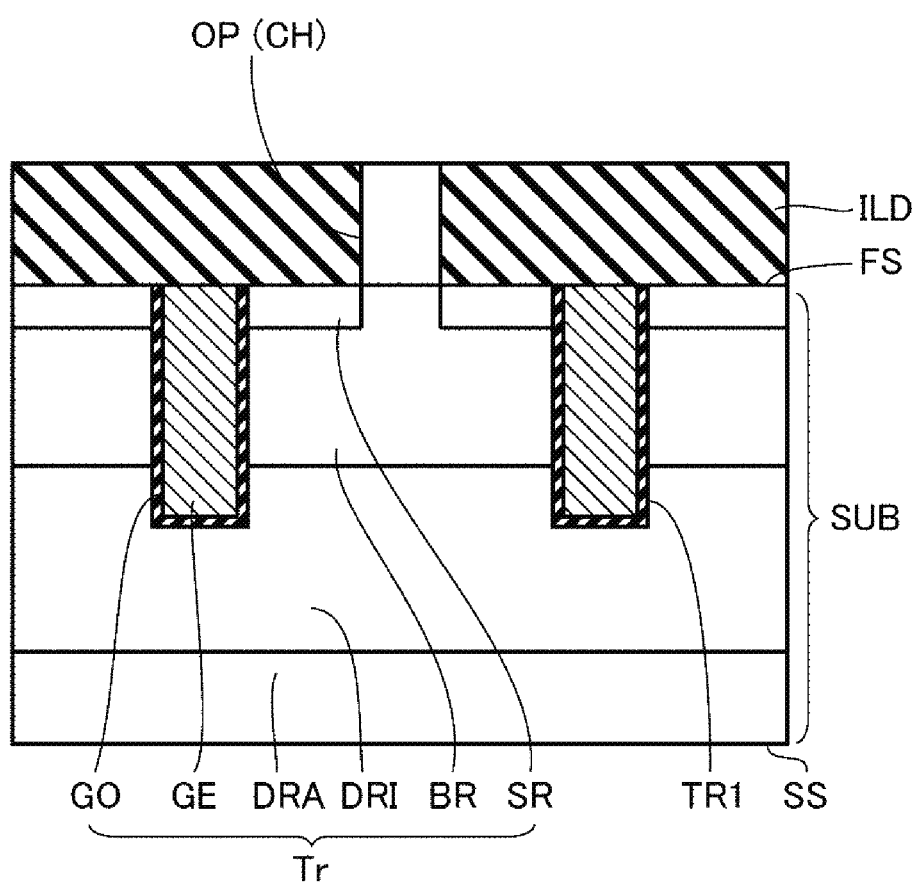
FIG. 14 is a cross-sectional view of the semiconductor device according to the first embodiment in the hard mask removing step S9.

In the hard mask removing step S9, as shown in FIG. 14, the hard mask HM is removed. The hard mask HM is removed by, for example, wet etching using phosphoric acid. The portion from which the hard mask HM is removed becomes the contact hole CH.

Figure 15:
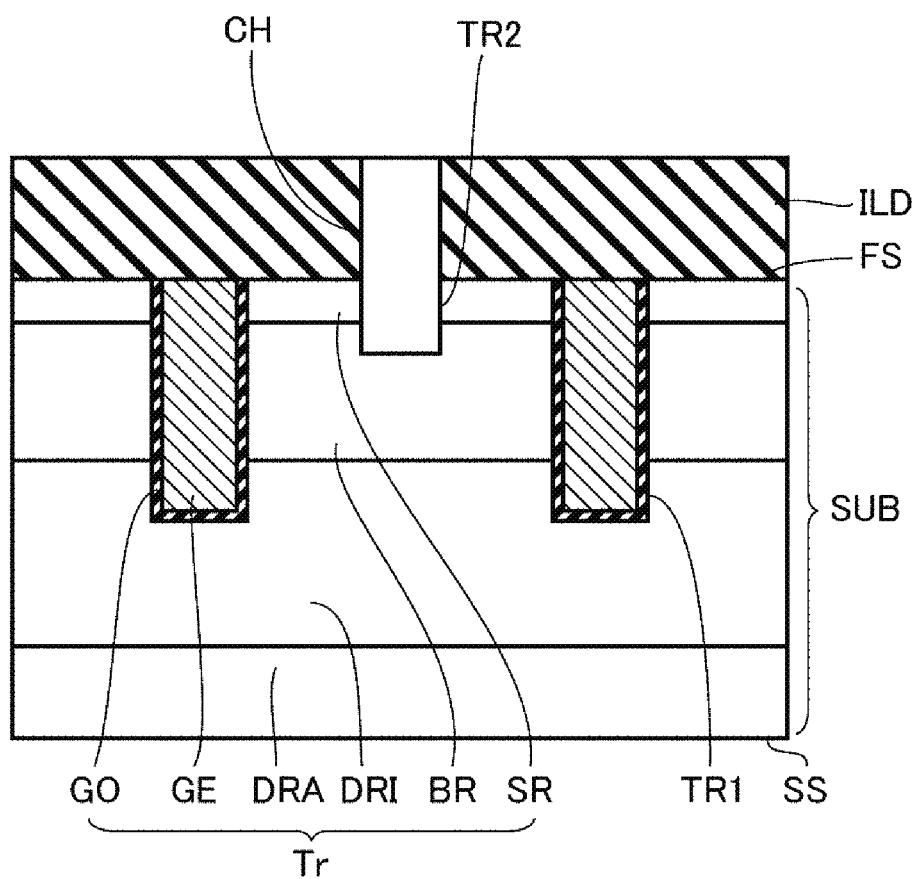
FIG. 15 is a cross-sectional view of the semiconductor device according to the first embodiment in the contact trench forming step S10.

In the contact trench forming step S10, as shown in FIG. 15, a contact trench TR2 is formed. The contact trench TR2 is formed by anisotropically etching such as RIE using the interlayer insulating film ILD as a mask.

Figure 16:
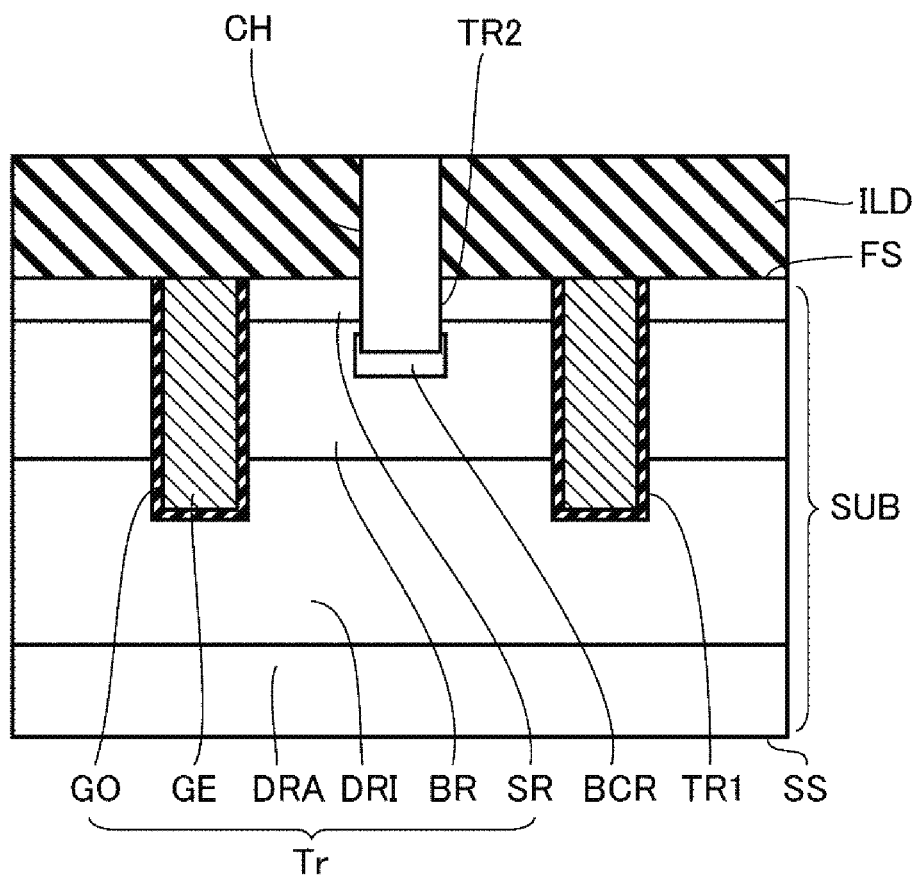
FIG. 16 is a cross-sectional view of the semiconductor device according to the first embodiment in the body contact region forming step S11.
Figure 17:
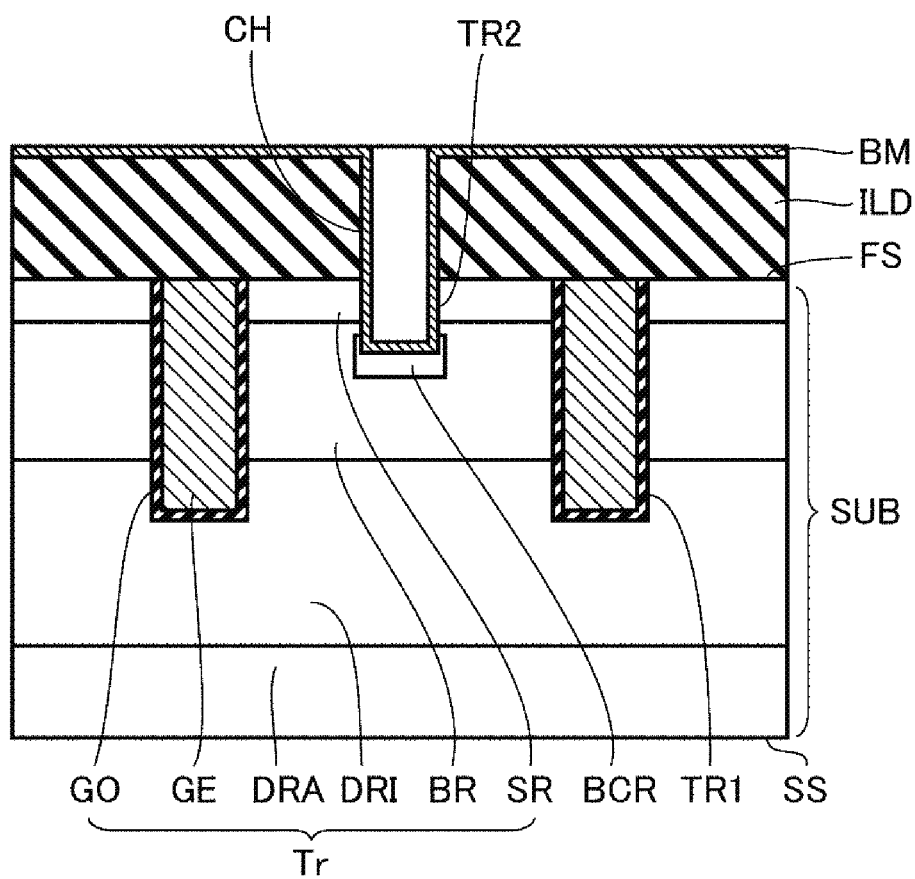
FIG. 17 is a cross-sectional view of the semiconductor device according to the first embodiment in the barrier metal forming step S12.

In the body contact region forming step S11, as shown in FIG. 16, the body contact region BCR is formed. The body contact region BCR is formed, for example, by controlling ion implantation and heat treatment. In the barrier metal forming step S12, the barrier metal BM is formed as shown in FIG. 17. The barrier metal BM is formed by, for example, sputtering. After the barrier metal BM is formed, heat treatment is performed. By the heat treatment, the silicon in the semiconductor substrate SUB reacts with the barrier metal BM, whereby the side surface and the bottom surface of the contact trench TR2 are silicided.

Figure 18:
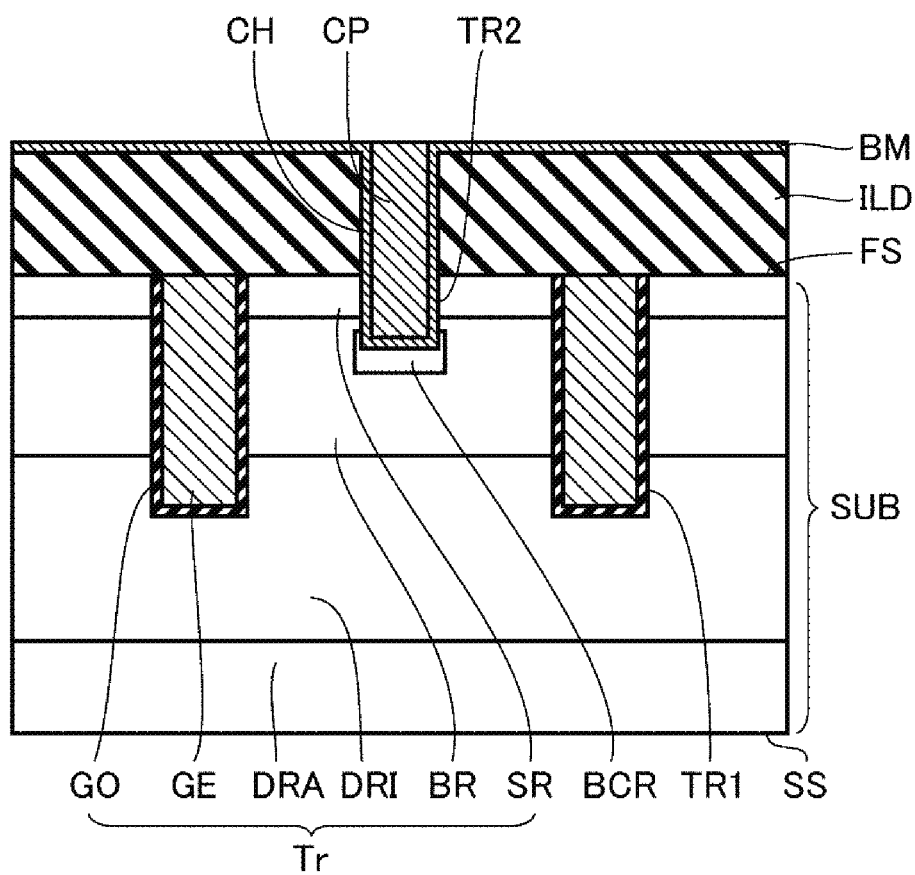
FIG. 18 is a cross-sectional view of the semiconductor device according to the first embodiment in the contact plug forming step S13.

In the contact plug forming step S13, as shown in FIG. 18, a contact plug CP is formed. In the formation of the contact plug CP, firstly, a film of a material constituting the contact plug CP is formed by CVD or the like. In the formation of the contact plug CP, second, the material constituting the contact plug CP protruding from the contact hole CH is removed by etching back. Instead of etching back, CMP may be performed.

Figure 19:
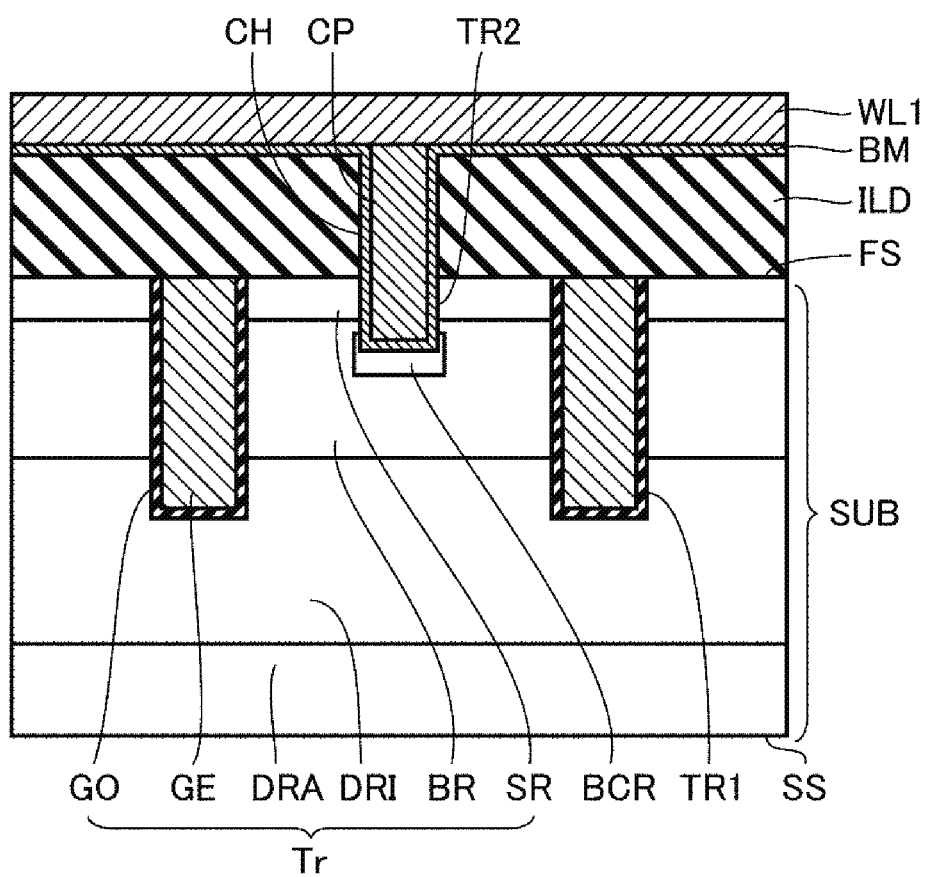
FIG. 19 is a cross-sectional view of the semiconductor device according to the first embodiment in the first electrode forming process S14.

In the first electrode forming step S14, as shown in FIG. 19, a source electrode WL1 and a gate electrode WL3 (not shown in FIG. 19) are formed. In forming the source electrode WL1 and the gate electrode WL3, first, materials constituting the source electrode WL1 and the gate electrode WL3 are formed on the interlayer insulating film ILD by, for example, sputtering. In forming the source electrode WL1 and the gate electrode WL3, second, materials constituting the deposited source electrode WL1 and the gate electrode WL3 are patterned by photolithography and etch.

In the second electrode forming step S15, the drain electrode WL2 is formed. The drain electrode WL2 is formed, for example, by sputtering.

Prior to forming the drain electrodes WL2, the second surface SS of the semiconductor substrate SUB is ground. Thus, the structure of the semiconductor device according to the first embodiment shown in FIG. 1 is formed.

Hereinafter, effects of the method for manufacturing a semiconductor device according to the first embodiment will be described.

As described above, in the manufacturing process of the semiconductor device according to the first embodiment, the opening OP formed in the hard mask HM for forming the gate trench TR1 is enlarged, the interlayer insulating film ILD is buried in the opening OP, and then the hard mask HM is removed to form a mask for forming the contact hole CH and the contact trench TR2. Therefore, in the manufacturing process of the semiconductor device according to the first embodiment, the contact hole CH and the contact trench TR2 can be formed in a self-aligned manner.

Therefore, in the manufacturing process of the semiconductor device according to the first embodiment, unlike when the contact holes CH and the contact trenches TR2 are formed using the photolithography technique, there is no need to consider a margin of mask deviation, and the semiconductor device can be miniaturized. This miniaturization makes it possible to reduce the on-resistance of the transistor Tr.

In the method of manufacturing the semiconductor device according to the first embodiment, since the source region SR is formed by ion implantation using the hard mask HM as a mask, the source region SR can also be formed in self-alignment.

In the manufacturing method of the semiconductor device according to the first embodiment, when the hard mask HM has the first film HMa and the second film HMb, it is possible to suppress the thinning of the first film HMa and the rounding of the shoulder portion of the first film HMa when the width of the opening OP is enlarged. That is, in this case, it is possible to increase the width on the upper end side of the contact plug CP and secure the thickness of the interlayer insulating film ILD.

In the manufacturing method of the semiconductor device according to the first embodiment, when the interlayer insulating film ILD is formed of NSG and the first film HMa is formed of silicon nitride, the selection ratio between the interlayer insulating film ILD and the hard mask HM in the etching in the hard mask removing step S9 can be ensured. That is, in this case, it is possible to suppress an increase in the width of the contact hole CH, i.e., the width of the contact plug CP.

The configuration of the semiconductor device according to the second embodiment is the same as that of the semiconductor device according to the first embodiment. Therefore, a description of the configuration of the semiconductor device according to the second embodiment is omitted.

SECOND EMBODIMENT

The method of manufacturing a semiconductor device according to the Second Embodiment will be described below. It should be noted that differences from the manufacturing method of the semiconductor device according to the first embodiment will be mainly described, and description thereof will not be repeated.

Figure 20:
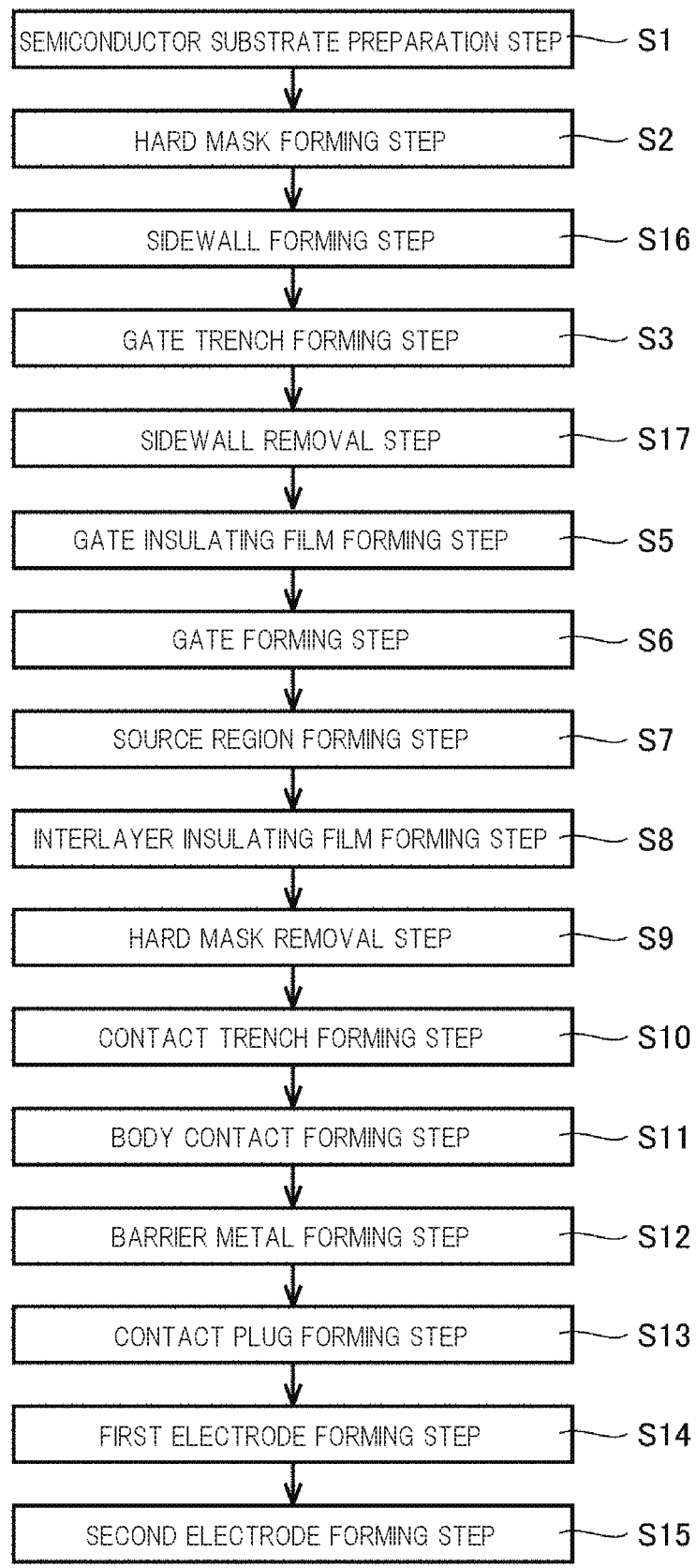
FIG. 20 is a process diagram showing a method of manufacturing a semiconductor device according to the second embodiment.

As shown in FIG. 20, the method for manufacturing a semiconductor device according to the second embodiment includes a semiconductor substrate preparation process S1, a hard mask forming step S2, a sidewall layer forming step S16, a gate trench forming step S3, a sidewall layer removal step S17, a gate insulating film forming step S5, a gate forming step S6, and a source region forming step S7.

The method of manufacturing a semiconductor device according to the second embodiment further includes an interlayer insulating film forming step S8, a hard mask removing step S9, a contact trench forming step S10, a body contact region forming step S11, a barrier metal forming step S12, a contact plug forming step S13, a first electrode forming step S14, and a second electrode forming step S15.

That is, the manufacturing method of the semiconductor device according to the second embodiment is different from the manufacturing method of the semiconductor device according to the first embodiment in that the opening enlarging step S4 is not included and the sidewall layer forming step S16 and the sidewall layer removing step S17 are included. The method of manufacturing the semiconductor device according to the second embodiment is different from the method of manufacturing the semiconductor device according to the first embodiment in the details of the hard mask forming step S2 and the gate trench forming step S3.

Figure 21:
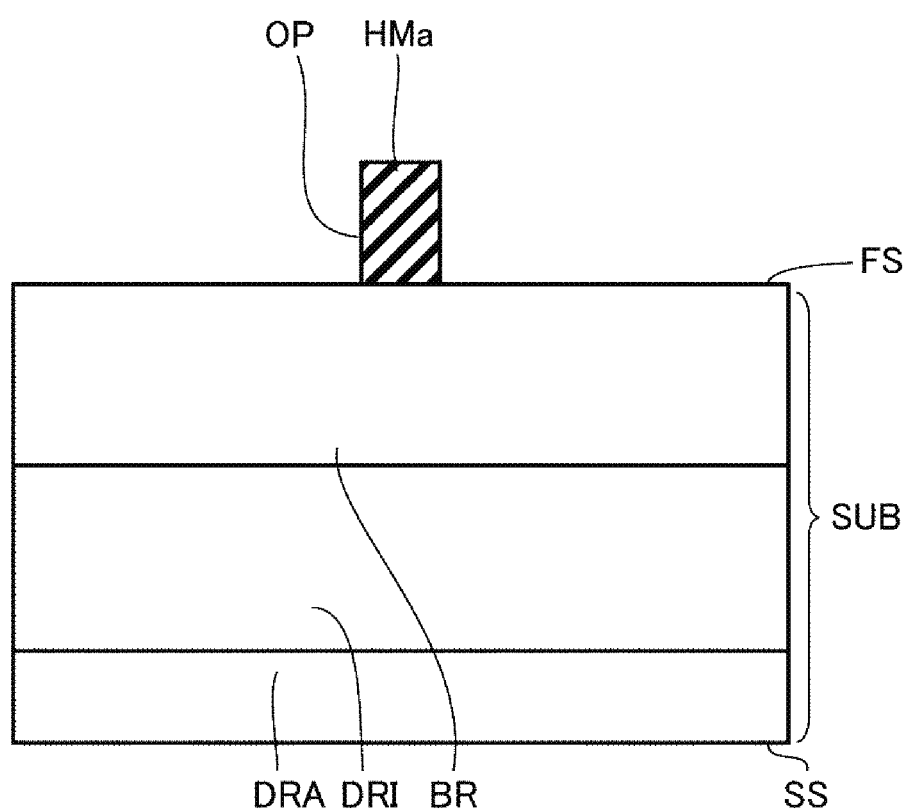
FIG. 21 is a cross-sectional view of the semiconductor device according to the second embodiment in the hard mask forming step S2.

As shown in FIG. 21, in the hard mask forming step S2, a hard mask HM is formed. However, in the hard mask forming step S2, only the first film HMa is formed. In the hard mask forming step S2, the opening OP of the hard mask HM is formed to have a wider width as compared with the manufacturing method of the semiconductor device according to the first embodiment.

Figure 22:
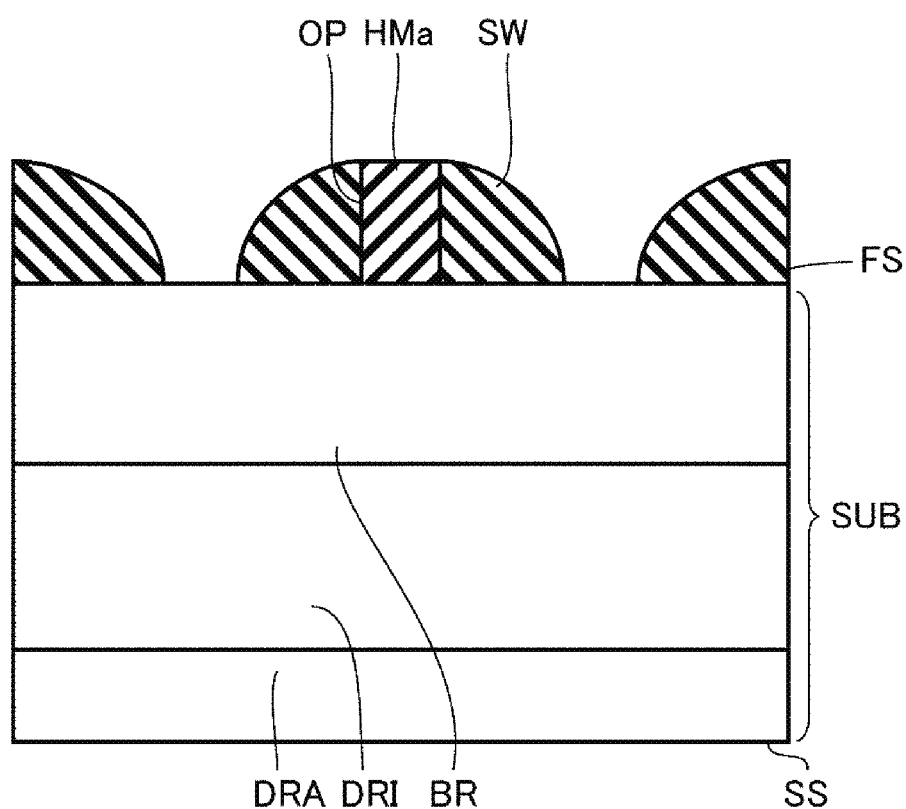
FIG. 22 is a cross-sectional view of the semiconductor device according to the second embodiment in the sidewall layer forming process S16.

The sidewall layer forming step S16 is performed after the hard mask forming step S2 and before the gate trench forming step S3. In the sidewall layer forming step S16, a sidewall layer SW is formed as shown in FIG. 22. The sidewall layer SW is formed on the side surface of the opening OP. The sidewall layer SW is formed of a material different from that of the hard mask HM. The sidewall layer SW is formed of, for example, silicon oxide. Preferably, the sidewall layers SW are formed of HTO (High Temperature Oxide).

In the formation of the sidewall layer SW, first, a material constituting the sidewall layer SW is formed on the first surface FS by, for example, CVD so as to cover the hard mask HM. The materials constituting the sidewall layers SW are preferably formed of LP-CVD (Low-Pressure Chemical Vapor Deposition). In the formation of the sideway layer SW, second, etching back is performed on the material constituting the deposited sidewall layer SW. This etch back is performed until the hard mask HM is exposed.

Figure 23:
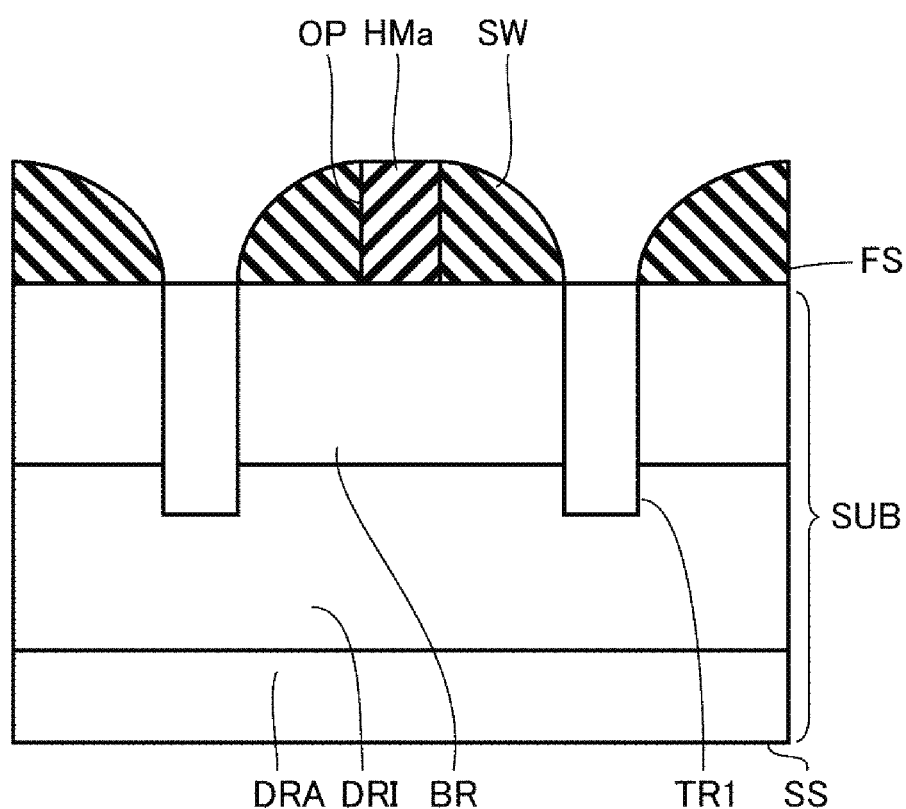
FIG. 23 is a cross-sectional view of the semiconductor device according to the second embodiment in the gate trench forming step S3.

In the gate trench forming step S3, the gate trench TR1 is formed. As shown in FIG. 23, the gate trench TR1 is formed by an anisotropic etch, such as RIE, masked by a hard mask HM (first film HMa) and a sidewall layer SW.

Figure 24:
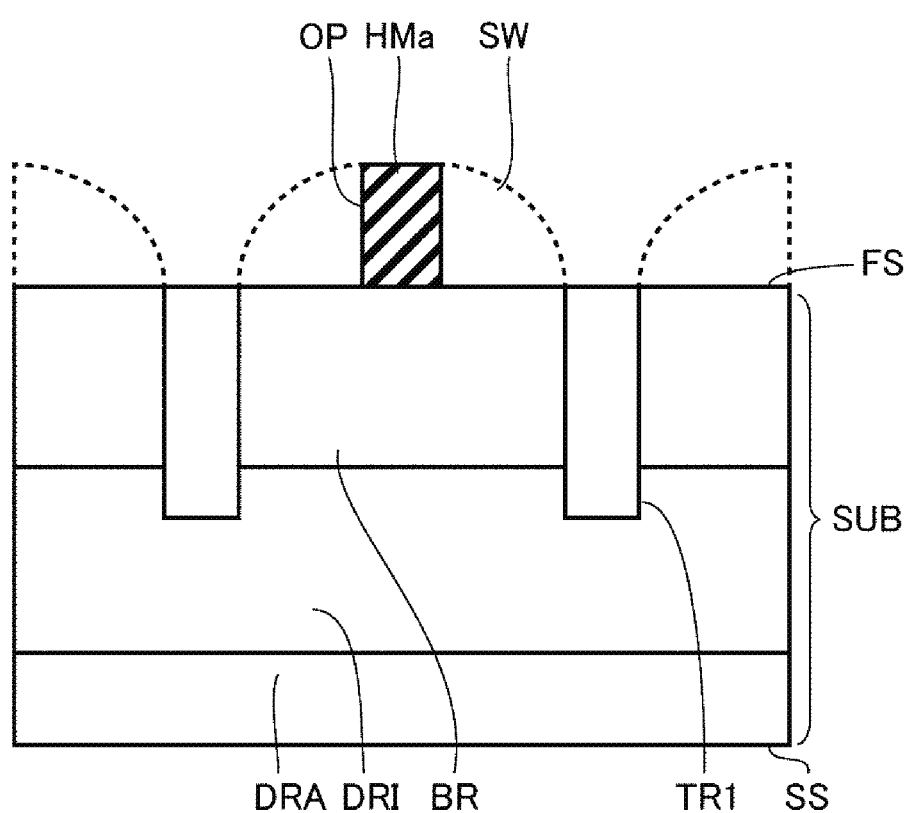
FIG. 24 is a cross-sectional view of the semiconductor device according to the second embodiment in the sidewall layer removing step S17.

The sidewall layer removing step S17 is performed after the gate trench forming step S3 and before the gate insulating film forming step S5. In the sidewall layer removing step S17, as shown in FIG. 24, the sidewall layer SW is removed. The sidewall layer SW is removed by, for example, wet etching.

Hereinafter, an effect of the method of manufacturing a semiconductor device according to the second embodiment will be described. Note that the difference from the effect of the manufacturing method of the semiconductor device according to the embodiment will be mainly described, and the description thereof will not be repeated.

In the manufacturing process of the semiconductor device according to the second embodiment, the spacing between the gate trenches TR1 and the width of the source regions SR are determined by the sum of the widths of the sidewall layers SW and the widths of the hard masks HM. The width of the sidewall layer SW can be easily changed by changing the thickness of the material constituting the sidewall layer SW to be formed in the sidewall layer forming process S 16. In particular, when the material constituting the sidewall layer SW is formed of CVD or LP-CVD, the thickness of the material constituting the sidewall layer SW to be formed can be accurately controlled. Therefore, the width of the gate trench TR1 and the width of the source region SR can be easily changed according to the manufacturing method of the semiconductor device according to the second embodiment.

Although the invention made by the present inventor has been specifically described based on the embodiment, the present invention is not limited to the embodiment described above, and it is needless to say that various modifications can be made without departing from the gist thereof.

What is claimed is:

1. A method of manufacturing a semiconductor device comprising:
    a step of preparing a semiconductor substrate having a first surface and a second surface that is opposite to the first surface,
    a step of forming a first mask film having a first opening on the first surface,
    a step of etching the semiconductor substrate in the first opening using the first mask film as an etching mask, a first gate trench and a second gate trench are formed in the semiconductor substrate so as to face each other,
    a step of forming a second mask film having a second opening narrower in width than the first mask film and wider in width than the first opening between the first gate trench and the second gate trench by processing the first mask film so as to increase the distance between the end of the first mask film defining the first opening and the first and second gate trenches a step of embedding a first insulating film in the second opening of the second mask,
    a step of forming a contact hole in the first insulating film by removing the second mask film.

2. The method of manufacturing a semiconductor device according to claim 1, further comprising a step of forming a contact trench on the first surface by etching the inside of the contact hole in plan view using the first insulating film as a mask.

3. The method of manufacturing a semiconductor device according to claim 1, further comprising a step of forming a source region on the first surface,
    wherein the source region is formed by performing ion implantation using the second mask film as a mask after processing the second opening and before the first insulating film is buried in the second opening.

4. The method of manufacturing a semiconductor device according to claim 1,
    the first mask layer includes a first layer formed on the first surface and a second layer formed on the first layer,
    wherein the first film is formed of a material different from that of the second film.

5. The method of manufacturing a semiconductor device according to claim 4,
    wherein the first layer is formed of silicon nitride,
    wherein the second film is formed of silicon oxide.

6. The method of manufacturing a semiconductor device according to claim 1,
    wherein the first insulating film is formed of NSG.

7. The method of manufacturing a semiconductor device according to claim 1,
    wherein the step of processing the second opening includes isotropic etching.

8. The method of manufacturing a semiconductor device according to claim 1,
    wherein the first mask film is a hard mask.

* * * * *